United States Patent
Ito

(10) Patent No.: US 9,496,175 B2
(45) Date of Patent: Nov. 15, 2016

(54) SEMICONDUCTOR DEVICE, METHOD OF MANUFACTURING THE SAME AND CAMERA

(71) Applicant: CANON KABUSHIKI KAISHA, Tokyo (JP)

(72) Inventor: Keisuke Ito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/918,946

(22) Filed: Oct. 21, 2015

(65) Prior Publication Data
US 2016/0133516 A1 May 12, 2016

(30) Foreign Application Priority Data

Nov. 11, 2014 (JP) ................. 2014-229121

(51) Int. Cl.
| H01L 27/14 | (2006.01) |
| H01L 21/768 | (2006.01) |
| H01L 21/321 | (2006.01) |
| H01L 27/146 | (2006.01) |
| H04N 5/225 | (2006.01) |

(52) U.S. Cl.
CPC ..... *H01L 21/76897* (2013.01); *H01L 21/3212* (2013.01); *H01L 27/14603* (2013.01); *H01L 27/14607* (2013.01); *H01L 27/14636* (2013.01); *H04N 5/2251* (2013.01)

(58) Field of Classification Search
CPC ................................................ H01L 27/14603
See application file for complete search history.

(56) References Cited

U.S. PATENT DOCUMENTS

| 6,057,899 A * | 5/2000 | Tanaka ................. G03B 21/208 349/5 |
| 6,157,429 A * | 12/2000 | Miyawaki ......... G02F 1/133526 349/138 |
| 7,470,981 B2 | 12/2008 | Egusa |
| 8,389,923 B2 * | 3/2013 | Naruse .............. H01L 27/14632 250/208.1 |
| 8,604,581 B2 * | 12/2013 | Ueno .................. H01L 27/1462 257/290 |

FOREIGN PATENT DOCUMENTS

JP 2006-100571 A 4/2006

* cited by examiner

*Primary Examiner* — Evan Pert
(74) *Attorney, Agent, or Firm* — Fitzpatrick, Cella, Harper & Scinto

(57) ABSTRACT

A semiconductor device includes a substrate that has a cell and a peripheral area, and an insulating layer. The insulating layer includes a first region located on the cell area and having outer edge along the cell area, a second region located on the peripheral area and having inner edge along the cell area, a third region located on an area between the cell and the peripheral area and a fourth region located between the second and the third region and forming a boundary with the third region. A conductive member is embedded in the first and the third region and no conductive member is embedded in the fourth region. The boundary has a curved portion.

17 Claims, 5 Drawing Sheets

SEMICONDUCTOR DEVICE, METHOD OF MANUFACTURING THE SAME AND CAMERA

BACKGROUND OF THE INVENTION

1. Field of the Invention

The present invention relates to a semiconductor device, a method of manufacturing the same, and a camera.

2. Description of the Related Art

Concerning planarization using chemical mechanical polishing (CMP), there is known a problem of a difference in polishing speed, which is caused by unevenness of the density of a pattern formed on a surface to be planarized. This may greatly lower the planarity. In particular, local overpolishing called Edge Over Erosion (EOE) occurs at the boundary between a region with a high pattern density and a region with a low pattern density.

Japanese Patent Laid-Open No. 2006-100571 describes arranging dummy via hole plugs while gradually decreasing the dummy via hole plug density from a region where via hole plugs are formed.

SUMMARY OF THE INVENTION

In a conventional technique, a portion where suppression of EOE is insufficient may be generated. Some embodiments of the present invention provide a technique of improving the planarity.

According to some embodiments, a semiconductor device including a substrate with a cell area in which unit circuits are arranged in a matrix, and a peripheral area arranged around the cell area, and an insulating layer arranged on the substrate, wherein in a plan view of a surface of the substrate, the insulating layer comprises: a first region located on the cell area and having a rectangular outer edge including two sides along a row of the unit circuits and two sides along a column of the unit circuits; a second region located on the peripheral area and having a rectangular inner edge including two sides along a row of the cell area and two sides along a column of the cell area; a third region located on an intermediate area between the cell area and the peripheral area; and a fourth region located on the intermediate area, located between the second region and the third region, and forming a boundary with the third region, a conductive member is embedded in the first region and the third region, and no conductive member is embedded in the fourth region, and the boundary has a curved portion, is provided.

According to some other embodiments, a semiconductor device including a substrate with a cell area in which unit circuits are arranged in a matrix, and a peripheral area arranged around the cell area, and an insulating layer arranged on the substrate, wherein in a plan view of a surface of the substrate, the insulating layer comprises: a first region located on the cell area and having a rectangular outer edge including two sides along a row of the unit circuits and two sides along a column of the unit circuits; a second region located on the peripheral area and having a rectangular inner edge including two sides along a row of the cell area and two sides along a column of the cell area; a third region located on an intermediate area between the cell area and the peripheral area; and a fourth region located on the intermediate area, located between the second region and the third region, and forming a boundary with the third region, a conductive member is embedded in the first region at a first pattern density, the conductive member is embedded in the second region at a second pattern density, the conductive member is embedded in the third region at a third pattern density, and the conductive member is embedded in the fourth region at a fourth pattern density, the fourth pattern density is lower than the first pattern density, the second pattern density, and the third pattern density, and the boundary has a curved portion, is provided.

According to some other embodiments, a camera comprising: a semiconductor device; and a signal processing unit configured to process a signal obtained by the semiconductor device, wherein the device includes a substrate with a cell area in which unit circuits are arranged in a matrix, and a peripheral area arranged around the cell area, and an insulating layer arranged on the substrate, in a plan view of a surface of the substrate, the insulating layer comprises: a first region located on the cell area and having a rectangular outer edge including two sides along a row of the unit circuits and two sides along a column of the unit circuits; a second region located on the peripheral area and having a rectangular inner edge including two sides along a row of the cell area and two sides along a column of the cell area; a third region located on an intermediate area between the cell area and the peripheral area; and a fourth region located on the intermediate area, located between the second region and the third region, and forming a boundary with the third region, a conductive member is embedded in the first region and the third region, and no conductive member is embedded in the fourth region, the boundary has a curved portion, the unit circuit comprises a pixel circuit, and the cell area comprises a light-receiving area, is provided.

According to some other embodiments, a method of manufacturing a semiconductor device, wherein the device includes a substrate with a cell area in which unit circuits are arranged in a matrix, and a peripheral area arranged around the cell area, and an insulating layer arranged on the substrate, in a plan view of a surface of the substrate, the insulating layer comprises: a first region located on the cell area and having a rectangular outer edge including two sides along a row of the unit circuits and two sides along a column of the unit circuits; a second region located on the peripheral area and having a rectangular inner edge including two sides along a row of the cell area and two sides along a column of the cell area; a third region located on an intermediate area between the cell area and the peripheral area; and a fourth region located on the intermediate area, located between the second region and the third region, and forming a boundary with the third region, a conductive member is embedded in the first region and the third region, and no conductive member is embedded in the fourth region, and the boundary has a curved portion, and the method comprises: forming the insulating layer on the substrate and forming an opening in the insulating layer; depositing a conductive material on the substrate, thereby embedding the conductive material in the opening; and removing a portion on the insulating layer of the conductive material by chemical mechanical polishing, thereby forming the conductive member, is provided.

Further features of the present invention will become apparent from the following description of exemplary embodiments (with reference to the attached drawings).

DESCRIPTION OF THE EMBODIMENTS

Figure 1:
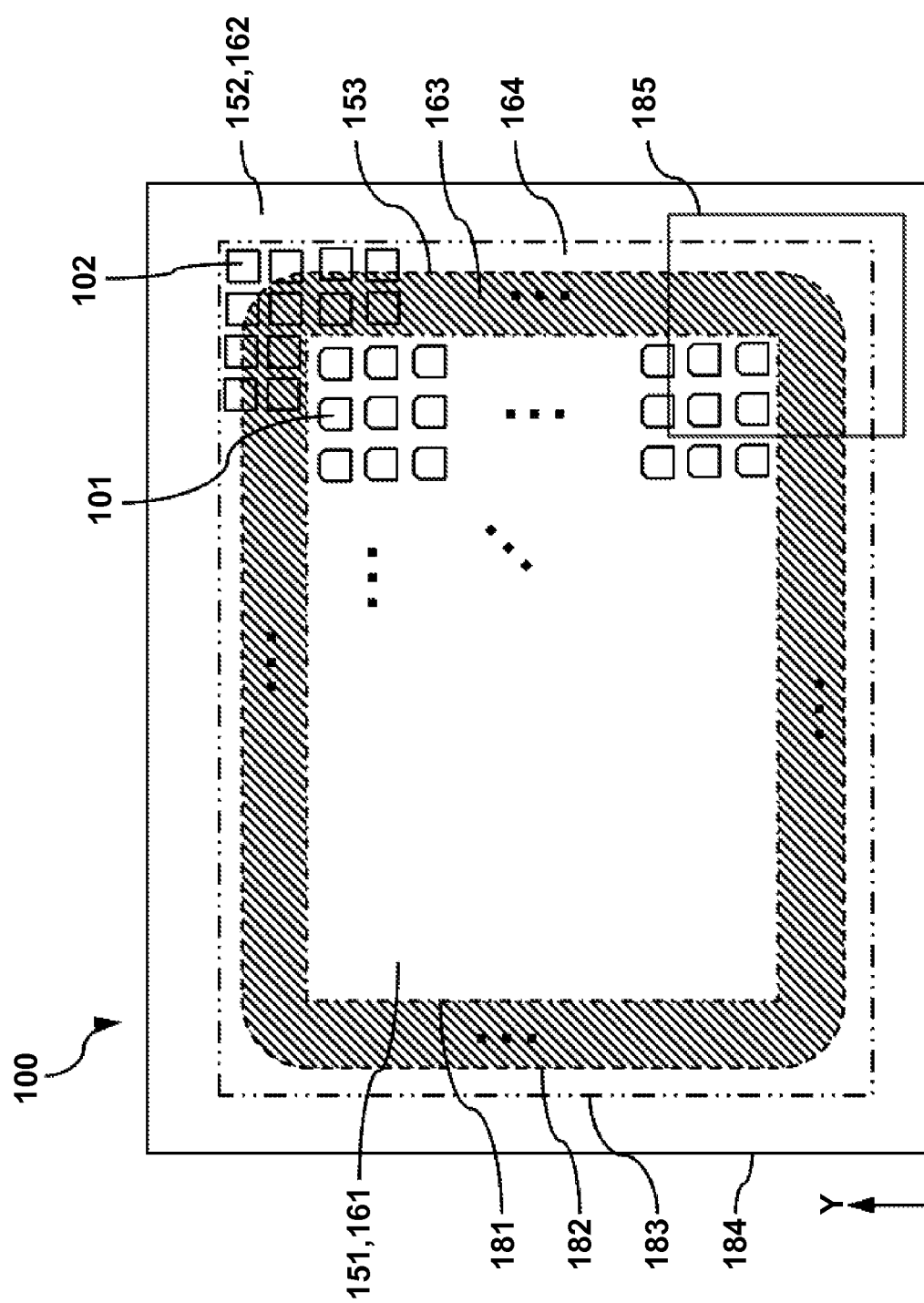
FIG. 1 is a plan view of a semiconductor device according to an embodiment of the present invention.

Detailed embodiments of a semiconductor device and a manufacturing method according to the present invention will now be described. Note that in the following explanation and drawings, the same reference numbers denote the same parts throughout a plurality of drawings. Hence, the same parts will be described by cross-referring to the plurality of drawings, and a description of the parts denoted by the same reference numerals will appropriately be omitted.

The structure and manufacturing method of the semiconductor device according to the present invention will be described with reference to FIGS. 1 to 4, 5A, and 5B. In this embodiment, the semiconductor device includes a cell area in which unit circuits are arranged in a matrix. As an example of the semiconductor device, a solid-state image sensor including a pixel area serving as a cell area where pixel circuits that are unit circuits are arranged periodically, and a peripheral area arranged around the pixel area will be handled. In the solid-state image sensor, the pixel area is a light-receiving area. In the semiconductor device, various kinds of conductive members are arranged. In this embodiment, out of these members, the arrangement of a contact plug that is located in a contact hole formed in an interlayer dielectric film and connects a semiconductor element formed on a substrate to a wire on the interlayer dielectric film serving as an insulating layer will be described. However, the present invention is not limited to this embodiment. The conductive member may be, for example, a wiring pattern made of a metal such as aluminum or copper or a via plug formed in a via hole that connects a wire in a lower layer and that in an upper layer of a multilayered structure. The present invention can be applied not only to a solid-state image sensor but also to another semiconductor device including a cell area in which unit circuits are periodically arranged, for example, a semiconductor storage device including a memory cell area in which memory circuits are periodically arranged in an array.

Figure 2:
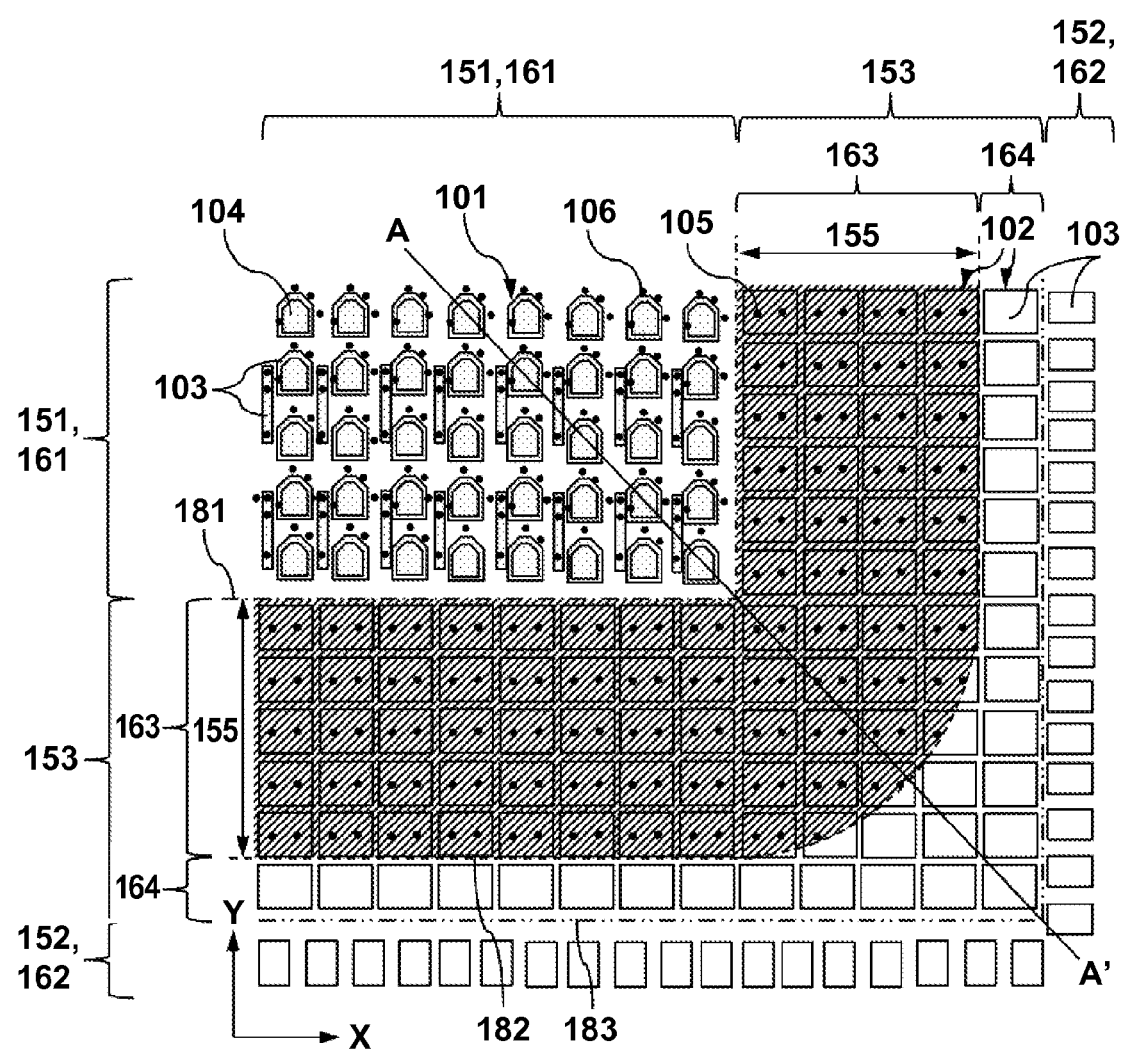
FIG. 2 is an enlarged view of a portion shown in FIG. 1.

FIG. 1 is a plan view of a solid-state image sensor 100 according to this embodiment. FIG. 2 is an enlarged view of a portion 185 surrounded by a rectangle in FIG. 1. The substrate of the solid-state image sensor 100 includes a pixel area 151 having an almost rectangular outer edge, and a peripheral area 152 arranged around the pixel area 151 and having an almost rectangular inner edge. The substrate also includes an intermediate area 153 arranged between the pixel area 151 and the peripheral area 152. The intermediate area 153 is adjacent to the pixel area 151 and surrounds the pixel area 151. The peripheral area 152 is adjacent to the intermediate area 153 and surrounds the pixel area 151 and the intermediate area 153. An interlayer dielectric film is formed on the pixel area 151, the intermediate area 153, and the peripheral area 152, and a contact plug described above is arranged.

In this embodiment, out of the interlayer dielectric film, a region located on the pixel area 151 will be referred to as a pixel region 161, and a region located on the peripheral area 152 will be referred to as a peripheral region 162. Referring to FIGS. 1 and 2, the outer edge of the pixel region 161 is indicated by an alternate long and short dashed line 181, and the inner edge of the peripheral region 162 is indicated by an alternate long and two short dashed line 183. In a plan view of the substrate of the solid-state image sensor 100, a relationship may hold in which the outer edge of the pixel region 161 of the interlayer dielectric film almost matches the outer edge of the pixel area 151, and the pixel region 161 includes the pixel area 151. For example, the outer edge of the pixel region 161 matches the outer edge of the pixel area 151 or is located outside the outer edge of the pixel area 151 but not inside the outer edge of the pixel area 151. A relationship may hold in which the inner edge of the peripheral region 162 of the interlayer dielectric film almost matches the inner edge of the peripheral area 152, and the peripheral region 162 includes the peripheral area 152. For example, the inner edge of the peripheral region 162 matches the inner edge of the peripheral area 152 or is located outside the inner edge of the peripheral area 152 but not inside the inner edge of the peripheral area 152.

The outer edge of the pixel region 161 of the interlayer dielectric film is rectangular, and the inner edge of the peripheral region 162 of the interlayer dielectric film is also rectangular. In this embodiment, a rectangle means a quadrilateral whose four interior angles are 90°. A square whose four sides have equal lengths is included as a kind of rectangle. The outer edge of the pixel region 161 includes two sides (for example, long sides) along the rows of pixel circuits 101 and two sides (for example, short sides) along the columns of the pixel circuits 101. The inner edge of the peripheral region 162 includes two sides (for example, long sides) along the rows of the pixel circuits 101 and two sides (for example, short sides) along the columns of the pixel circuits 101. Hence, the two sides of the outer edge of the pixel region 161 are parallel to the two sides of the inner edge of the peripheral region 162. At each of four corners of the outer edge of the pixel region 161, a side along the rows of the pixel circuits 101 and a side along the columns of the pixel circuits 101 continue. Out of the interlayer dielectric film, a region located on the intermediate area 153 is divided into two regions which will be referred to as a first intermediate region 163 and a second intermediate region 164. In this embodiment, a contact plug 105 is arranged in the first intermediate region 163 but not in the second intermediate region 164.

Referring to FIG. 1, the pixel area 151 and the pixel region 161 are inner regions surrounded by the alternate long and short dashed line 181. The intermediate area 153 adjacent to the pixel area 151 is a region between the alternate long and short dashed line 181 and the alternate long and two short dashed line 183. Out of the interlayer dielectric film arranged on the intermediate area 153, the first intermediate region 163 is a hatched region between the alternate long and short dashed line 181 and a boundary 182 indicated by a dotted line, and the second intermediate region 164 is a region between the boundary 182 and the alternate long and two short dashed line 183. The position of the boundary 182 corresponding to the outer edge of the first intermediate region 163 will be described later. The peripheral area 152 and the peripheral region 162 include a region between the alternate long and two short dashed line 183 and a solid line 184. The solid line 184 indicates the edge of the solid-state image sensor 100. Active regions of the semiconductor elements of the outermost pixel circuits arranged in the pixel area 151 are located in the pixel area 151. The active regions of the semiconductor elements of innermost peripheral circuits arranged in the peripheral area 152 are located in the peripheral area 152. The inner edge of the intermediate area 153 is adjacent to the active regions of the semiconductor elements of the outermost pixel circuits in the pixel area 151, and the outer edge of the intermediate area 153 is adjacent to the active regions of the semiconductor elements of the innermost peripheral circuits in the peripheral area 152.

The pixel area 151 is a region in which the plurality of pixel circuits 101 each including a photoelectric conversion unit and a signal generation unit configured to generate a signal based on a change amount generated in the photoelectric conversion unit are periodically arranged in a matrix. The photoelectric conversion unit includes a photodiode and the like. The signal generation unit includes a transfer gate, a floating node, an amplifier transistor, a reset transistor, and the like. The signal generation unit may be shared by a plurality of pixel circuits 101. The signal generation units of the pixel circuits 101 are connected by wires (global wires) on a row or column basis, and wiring patterns (not shown) are arranged in the row and column directions between the pixel circuits 101. Contact plugs 106 that are conductive members are arranged at a pattern density Dc in the pixel region 161 on the pixel area 151. The pattern density of conductive members in a predetermined region is represented by the percentage of the sum of the projection areas of all conductive members embedded in the predetermined region on the substrate to the total area of the predetermined region.

The pixel area 151 includes light-receiving pixels, first reference pixels, and second reference pixels. The pixel circuit 101 of a light-receiving pixel includes a photoelectric conversion unit capable of receiving light, and a signal generation unit configured to generate a signal based on charges generated in the photoelectric conversion unit. The signal generated by the signal generation unit of the pixel circuit 101 of the light-receiving pixel forms an image. The pixel circuit 101 of a first reference pixel includes a light-shielded photoelectric conversion unit, and a signal generation unit configured to generate a signal based on charges generated in the light-shielded photoelectric conversion unit. The pixel circuit 101 of a second reference pixel includes a signal generation unit but no photoelectric conversion unit. The signals generated by the signal generation units of the first reference pixel and the second reference pixel are used as reference signals to remove noise from the signal generated by the light-receiving pixel.

The peripheral area 152 includes a signal processing circuit configured to process a signal from the signal generation unit of each pixel circuit 101 in the pixel area 151. The peripheral area 152 also includes a driving circuit (vertical driving circuit) configured to drive the pixel circuits 101 on a row basis, a driving circuit (horizontal driving circuit) configured to drive the signal processing circuits for each column of the pixel circuits 101, an output circuit, and the like. The signal processing circuit includes peripheral circuits such as a readout circuit including a constant current source and the like, a correlated double sampling circuit (CDS circuit), an analog/digital conversion circuit (ADC circuit), and an amplifier circuit. In addition, for example, the peripheral area 152 may be provided with a digital signal processing circuit configured to process a digital signal generated by the ADC circuit. The contact plugs 106 that are conductive members are arranged at a pattern density Dp in the peripheral region 162 on the peripheral area 152.

The intermediate area 153 will be described next. The intermediate area 153 includes wires (not shown) that connect the pixel area 151 and the peripheral area 152. The intermediate area 153 need not always include the pixel circuits 101 and the peripheral circuits. Dummy elements 102 are arranged in the intermediate area 153. Each dummy element 102 may have a shape similar to the structure of the pixel circuit 101 arranged in the pixel area 151. The dummy element 102 may have the same stacked structure as the pixel circuit 101. If the dummy element 102 has the shape similar to the pixel circuit 101 or the stacked structure, a step difference is hardly generated in the interlayer dielectric film that exists on the pixel area 151 and the intermediate area 153. The dummy element 102 need not always output a signal that contributes to image formation.

The outer edge of the first intermediate region 163 includes four straight portions parallel to the four sides of the pixel area 151 out of the intermediate area 153, and curved portions each of which connects straight portions adjacent to each other out of the four straight portions. In this embodiment, the outer edge of the first intermediate region 163 matches the boundary 182 between the first intermediate region 163 and the second intermediate region 164. That is, the first intermediate region 163 is a region between the pixel region 161 and the boundary 182. In a plan view of the substrate surface, each curved portion projects in the direction to separate from the pixel region 161. In this embodiment, the first intermediate region 163 is a region including rectangular areas between the outer edge of the pixel region 161 and straight portions at a predetermined distance 155 from the outer edge, and sector areas inside the curved portions at the predetermined distance 155 for the corners of the pixel area 151. For this reason, in this embodiment, each curved portion has a quadrant arc shape with a radius equal to the distance 155.

In the first intermediate region 163, the contact plugs 105 are arranged at a pattern density Dm. A pattern density Dn of contact plugs in the second intermediate region 164 is lower than the pattern density Dm (Dn<Dm). The pattern density Dn of contact holes in the second intermediate region 164 is lower than the pattern densities Dc and Dp (Dn<Dc, Dn<Dp). In this embodiment, since no contact plug is arranged in the second intermediate region 164, the pattern density Dn of contact plugs in the second intermediate region 164 is 0 (Dn=0). However, the pattern density Dn of contact plugs in the second intermediate region 164 may not always be 0. The contact plug 105 farthest from the pixel region 161 may be arranged on the boundary 182 spaced apart from the outer edge of the pixel region 161 by the distance 155. The contact plugs 105 may be evenly distributed all over the first intermediate region 163. That is, the contact plugs 105 may regularly be arranged as a periodical pattern all over, for example, the rectangular areas and sector areas. However, the contact plugs 105 may unevenly be distributed in the first intermediate region 163. For example, the first intermediate region 163 may locally include a portion where the pattern density equals the pattern density Dn.

The contact plug 105 has the same structure as the contact plug 106 arranged in the pixel region 161 and the peripheral region 162. The pattern density Dm may be an intermediate pattern density between the pattern densities Dc and Dp (Dc<Dm<Dp, or Dp<Dm<Dc).

The second intermediate region 164 is a region outside the rectangular areas and sector areas out of the interlayer dielectric film on the intermediate area 153, in other words, an area outside the boundary 182, and is adjacent to the inner edge of the peripheral region 162.

Figure 5A:
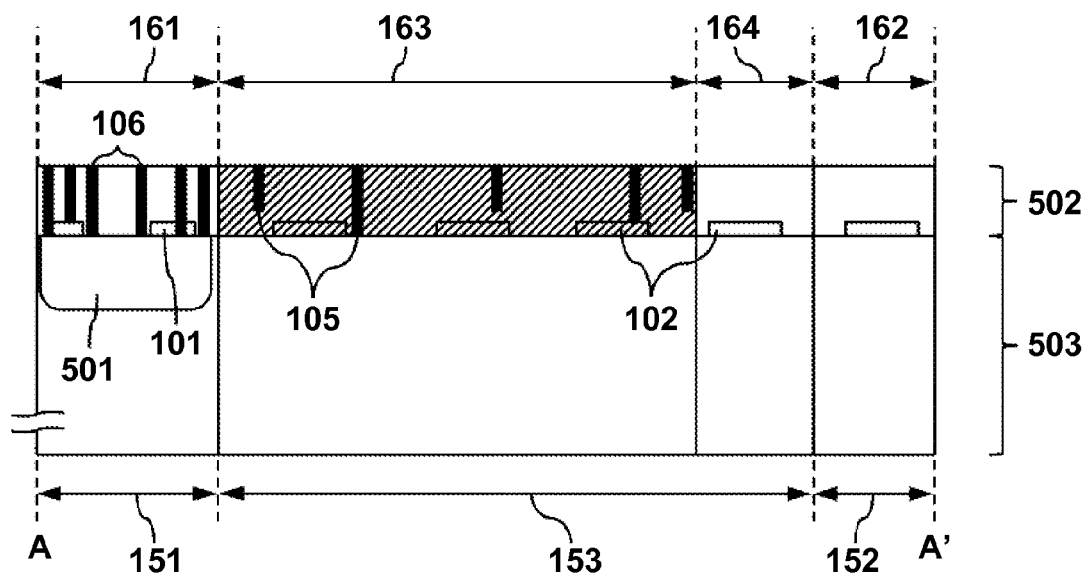
FIGS. 5A and 5B are sectional views taken along a line A-A' in FIGS. 2 and 4.

A method of manufacturing the solid-state image sensor 100 will be described next. As shown in FIGS. 1 and 2, the pixel circuits 101 and the like in the pixel area 151, the peripheral circuits and the like in the peripheral area 152, and the dummy elements 102 in the intermediate area 153 are formed on a substrate 503. Active regions 103 and the like are formed in the pixel area 151, the peripheral area 152, and the intermediate area 153. A charge accumulation region 104 and the like are formed in each pixel circuit 101 on the pixel area 151. In addition, for example, an insulating pattern (not shown) such as an element isolation region and a conductive pattern (not shown) made of a conductor using polysilicon or a metal, such as a wire that connects circuits or regions are formed. An insulating film serving as an interlayer dielectric film is formed on a region including the pixel area 151, the peripheral area 152, and the intermediate area 153 formed on the substrate 503. FIG. 5A is a sectional view of the solid-state image sensor 100 taken along a line A-A' in FIG. 2.

After formation of the insulating film, a planarization processing is performed for the insulating film as needed. A mask pattern is formed on the insulating film by, for example, photolithography. After formation of the mask pattern, a formation step of forming contact holes at desired positions in the pixel region 161, the first intermediate region 163, and the peripheral region 162 via openings of the mask pattern is performed.

The contact holes formed in the pixel region 161 and the peripheral region 162 are contact holes with openings extending up to the active region 103 or the conductive pattern. The contact holes formed in the first intermediate region 163 may be either contact holes with openings extending up to the active region 103 or the conductive pattern, or contact holes with openings extending up to the upper surface of an insulating pattern. The contact holes formed in the first intermediate region 163 need not extend through the insulating film and may have their bottoms in the interlayer dielectric film, as shown in FIG. 5A.

After the contact hole formation step, the mask pattern is removed, and a deposition step of depositing a conductive material including a metal such as copper, tungsten, or aluminum on the substrate 503 and embedding a conductor in each contact hole is performed. Deposition of the conductive material is performed by, for example, plating, chemical vapor deposition, or sputtering. Before the conductive material is deposited on the insulating film, a barrier metal layer using, for example, tantalum, titanium, or a nitride thereof may be formed to prevent conductive material diffusion into the underlying layer or improve the adhesion, and the conductive material may be formed on the barrier metal layer. After that, a planarization step of removing, out of the formed conductive material, a portion other than the conductive material embedded in the contact holes using chemical mechanical polishing (CMP) and planarizing the insulating film is performed. The contact plugs 105 and 106 are thus formed in the contact holes. Simultaneously, an interlayer dielectric film 502 having a flat surface is formed. The contact plugs 105 and 106 may be formed using a nonmetal material, for example, polysilicon.

Each of the contact plugs 106 formed in the pixel region 161 and the peripheral region 162 is connected to the active region 103 or the conductive pattern. Each contact plug 105 provided in the first intermediate region 163 may be a contact plug for well contact, which is connected to the active region 103 or the conductive pattern, and, for example, supplies the potential of a well 501 in the pixel area 151 from outside of the pixel area 151. The contact plug 105 may be a dummy contact plug that is connected to neither the active region 103 nor the conductive pattern and is not used for electrical connection.

In this embodiment, the pattern density Dc of the contact plugs in the pixel region 161 is higher than the pattern density Dp in the peripheral region 162 (Dp<Dc). The pattern density Dm of the contact plugs in the first intermediate region 163 is lower than the pattern density Dc of the contact plugs in the pixel region 161 (Dm<Dc). The pattern density Dm of the contact plugs in the first intermediate region 163 is higher than the pattern density Dp of the contact plugs in the peripheral region 162 (Dp<Dm). The pattern density Dm of the contact plugs in the first intermediate region 163 may equal at least one of the pattern densities Dc and Dp. For this reason, the pattern density of the contact plugs 105 in the first intermediate region 163 is equal to or lower than the pattern density of the contact plugs 106 in the pixel region 161 (Dm≤Dc). In addition, the pattern density of the contact plugs 105 in the first intermediate region 163 is equal to or higher than the pattern density of the contact plugs 106 in the peripheral region 162 (Dp≤Dm).

The effect of this embodiment will be described here. In the pixel region 161 on the pixel area 151, the pattern density of wiring pattern or the contact plugs 106 is higher. In the peripheral region 162 on the peripheral area 152, the pattern density of wiring pattern or the contact plugs 106 is different from that in the pixel region 161. For this reason, in the planarization step by CMP, overpolishing called Edge Over Erosion (EOE) readily occurs at the boundary between the pixel region 161 and the peripheral region 162 where the pattern density difference of the contact plugs 106 is large. In particular, the overpolishing amount by EOE readily increases in the corner areas of the pixel region 161.

Figure 3:
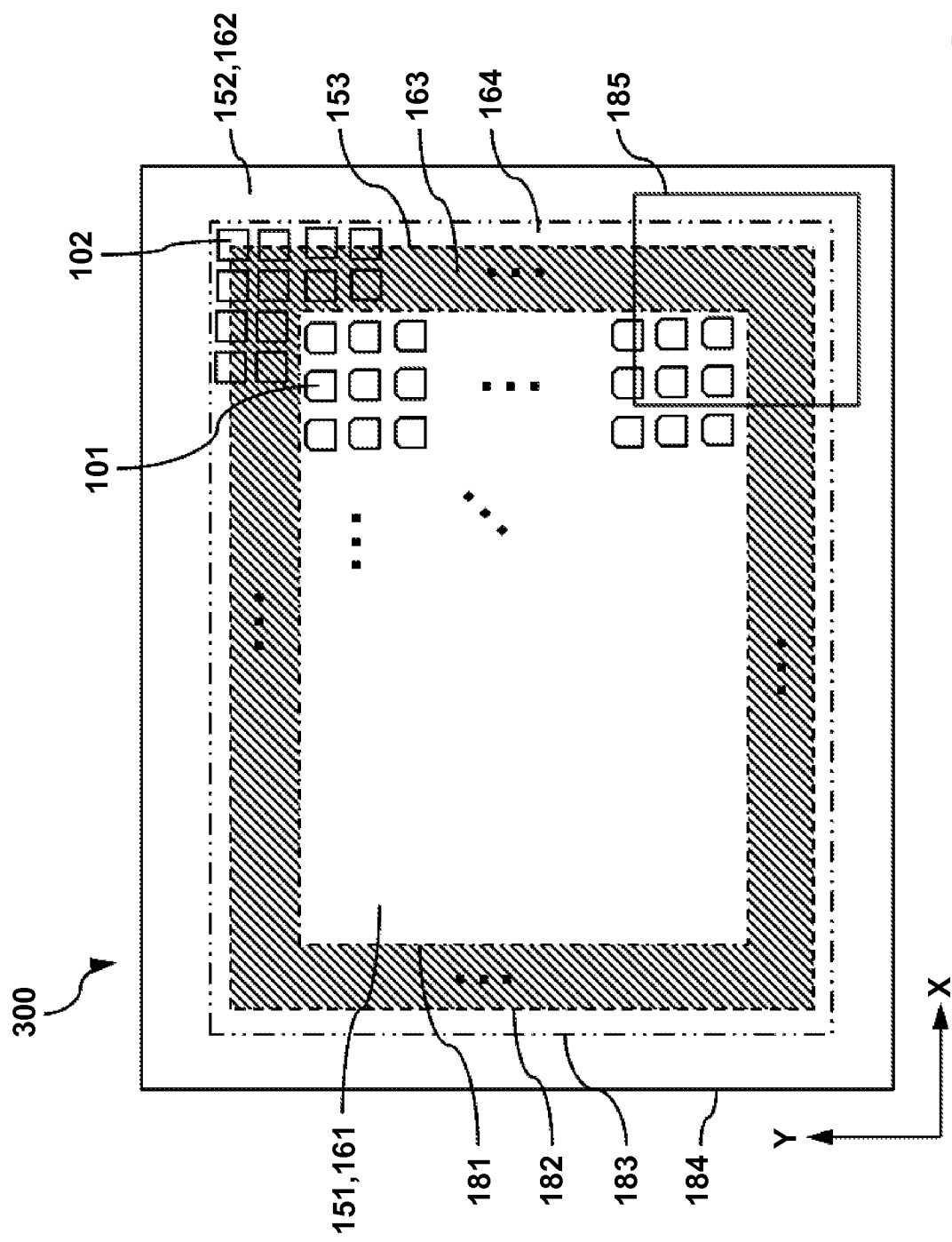
FIG. 3 is a plan view of a semiconductor device according to a comparative structure of the present invention.
Figure 4:
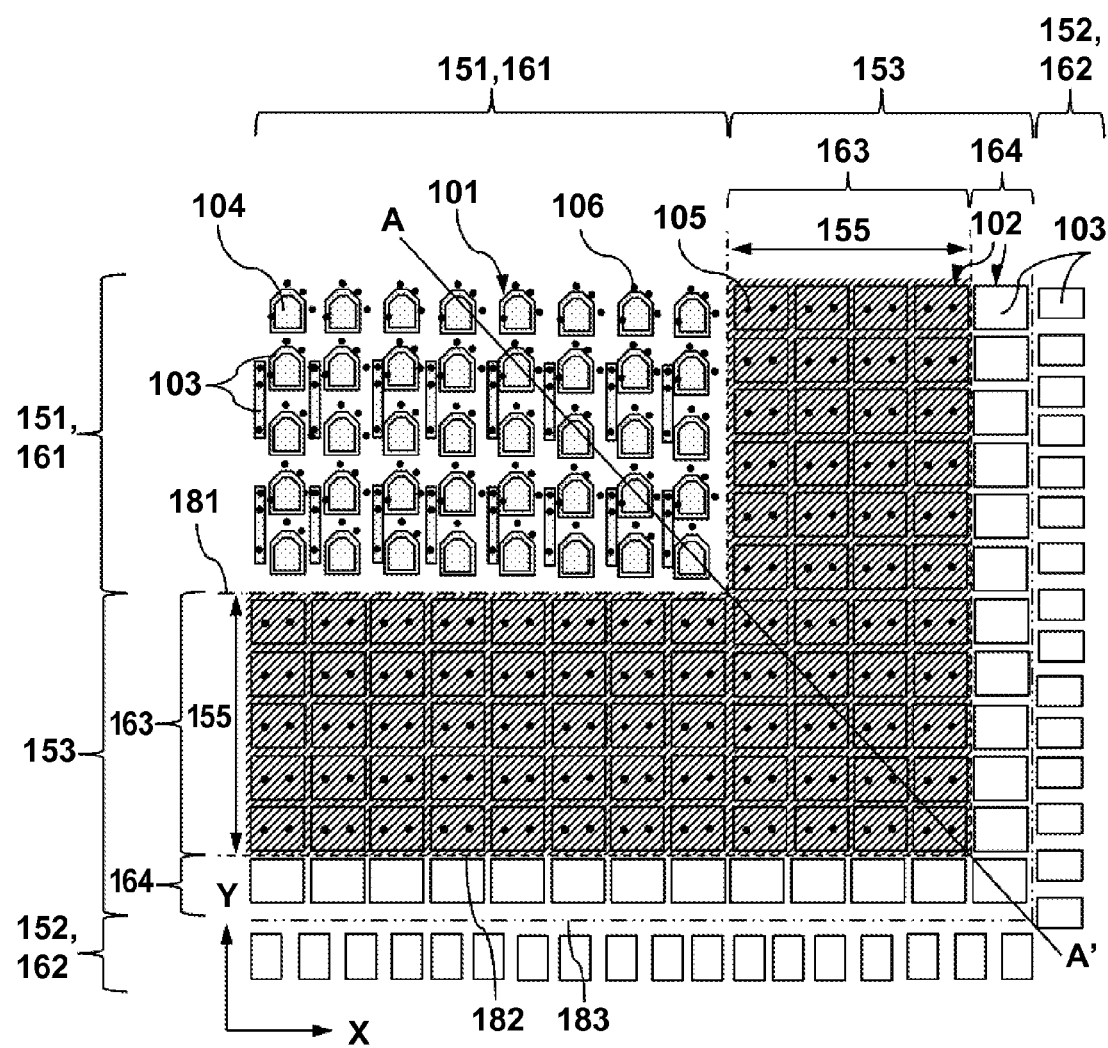
FIG. 4 is an enlarged view of a portion shown in FIG. 3.

FIGS. 3 and 4 show a solid-state image sensor 300 using a comparative structure of this embodiment. FIG. 4 is an enlarged view of the portion 185 of the solid-state image sensor 300 surrounded by a rectangle in FIG. 3. The intermediate area 153 is inserted between the pixel area 151 and the peripheral area 152. The first intermediate region 163 having the pattern density Dm that is an intermediate pattern density between the pattern densities Dc and Dp of contact plugs in the pixel region 161 and the peripheral region 162 is arranged in the interlayer dielectric film on the intermediate area 153. In addition, the second intermediate region 164 having the pattern density Dn (in this example, Dn=0) that is lower than the pattern densities Dc and Dp of the contact plugs in the pixel region 161 and the peripheral region 162 is arranged in the interlayer dielectric film on the intermediate area 153. By arranging the first intermediate region 163, the density difference of contact plugs between the pixel region 161 and the peripheral region 162 can be reduced, and overpolishing by EOE can be suppressed. However, each corner region at the outer edge of the first intermediate region 163 of the solid-state image sensor 300 has a right-angled shape. In the planarization step by CMP, the corner region where the pattern density of contact plugs changes readily receives a large load as compared to the straight region where the pattern density of contact plugs changes. Hence, EOE that is local overpolishing easily occurs. If unevenness is formed on the surface due to overpolishing, a problem may arise in pattern formation in an exposure step after the planarization step. In addition, when forming a conductive member on the upper layer, a residue of a metal may be generated in the planarization step by CMP of a metal such as copper, tungsten, or aluminum. If overpolishing occurs in a region close to the pixel area 151, the film thickness of the interlayer dielectric film formed on the photoelectric conversion units may vary, and degradation in optical characteristic, for example, color unevenness may occur. These problems may lead to lower productivity such as lower manufacturing yield.

Figure 5B:
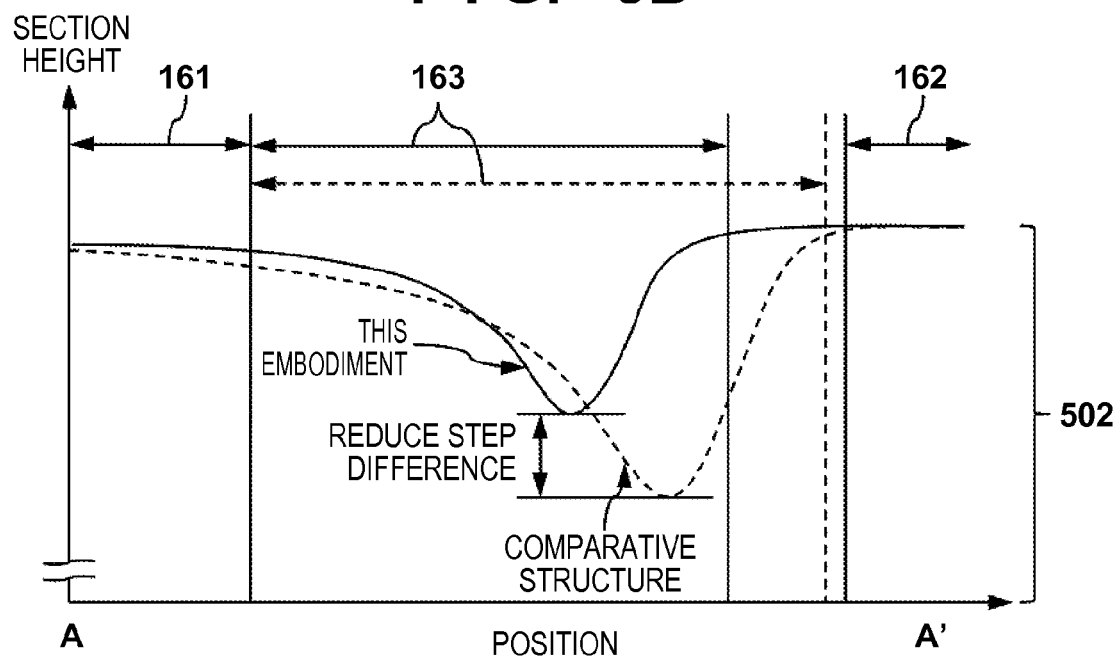

Meanwhile, in the solid-state image sensor 100 according to this embodiment, the first intermediate region 163 that reduces the density difference of the contact plugs is a region located within the range of the predetermined distance 155 from the outer edge of the pixel region 161 in a plan view of the surface of the solid-state image sensor 100. Hence, each corner region at the outer edge of the first intermediate region 163 has not a right-angled shape but a round curved shape. The load applied to the corner region in the planarization step by CMP is smaller than in the case where the corner region has a right-angled shape, and thus becomes close to the load applied to the straight regions. This reduces overpolishing in the corner regions. FIG. 5B is an enlarged sectional view of step differences on the surface of the interlayer dielectric film when a metal film is deposited and planarized by CMP, and a contact plug is formed in the section taken along the line A-A' in FIGS. 2 and 4. The solid line in FIG. 5B indicates the step difference on the surface of the solid-state image sensor 100 according to this embodiment, and the broken line indicates the step difference on the surface of the solid-state image sensor 300 of the comparative structure. In the solid-state image sensor 100 according to this embodiment, the distance of the first intermediate region 163 in the diagonal direction is shorter, as compared to the solid-state image sensor 300 manufactured by the comparative structure. However, in the planarization step by CMP, EOE caused by a change in the load in the corner region can be suppressed. For this reason, the step difference on the surface of the interlayer dielectric film can be made smaller, and the influence on the interlayer dielectric film on the neighborhood of the pixel area 151 is suppressed. This can improve the manufacturing yield and improve the productivity.

Here, the distance 155 may be, for example, 10 μm or more. When this condition is met, the effect of reducing the change in the density of conductive members such as contact plugs becomes larger, and overpolishing can sufficiently be suppressed in the planarization step by CMP. In the interlayer dielectric film on the intermediate area 153, the interval between the outer edge of the pixel region 161 and the inner edge of the peripheral region 162 may be the distance 155. That is, out of the first intermediate region 163, a straight portion at the predetermined distance 155 from the outer edge of the pixel region 161 may be in contact with the inner edge of the peripheral region 162. In this case, out of the interlayer dielectric film on the intermediate area 153, the second intermediate region 164 where no contact plugs 105 are formed is only the region of the corner region adjacent to the peripheral region 162 on the peripheral area 152.

In this embodiment, the distance 155 from the outer edge of the pixel region 161 to the straight portion of the outer edge of the first intermediate region 163 is constant throughout the outer edge of the pixel region 161. However, for example, the distance from the pixel region 161 may change between the sides of the outer edge of the pixel region 161. In this case, the distance from at least one corner of the outer edge of the pixel region 161 to the boundary 182 (curved portion) may equal the distance from at least one side continuing to the corner to the boundary 182 (straight portion). The corner regions out of the outer edge of the first intermediate region 163 may be round and connect the adjacent sides. The above-described alternate long and short dashed line 181, boundary 182, and alternate long and two short dashed line 183 may be positions where the density pattern of the conductive members embedded in the interlayer dielectric film changes. However, the alternate long and short dashed line 181, boundary 182, and alternate long and two short dashed line 183 do not indicate the positions themselves where the density pattern of the conductive members changes. Instead, they are virtual border lines defined in accordance with the above-described predetermined rule.

In this embodiment, the intermediate area 153 and the peripheral area 152 are formed to surround the pixel area 151. However, the intermediate area 153 and the peripheral area 152 may be formed into, for example, an L shape around two sides adjacent to each other out of the pixel area 151 or into a U shape along three sides adjacent to each other out of the pixel area 151. In this case, the first intermediate region 163 defined in the interlayer dielectric film on the substrate 503 may be formed into an L shape or U shape around two sides or three sides adjacent to each other out of the pixel region 161. In this case, not all corner regions in contact with the second intermediate region 164 out of the first intermediate region 163 need to have a round curved shape. At least one corner region having a round curved shape suffices. As for the shape and arrangement, each region need only have a shape and arrangement for suppressing overpolishing in at least one corner region of the pixel region 161. For example, at least one of the peripheral circuit and the conductive member may not be arranged in the peripheral area 152 and the peripheral region 162 of the solid-state image sensor 100, and the peripheral circuit may be arranged outside the solid-state image sensor 100. In the pixel area 151 that is a cell area, for example, the pixel circuits 101 may be arranged in a honeycomb pattern. It can be considered that in the honeycomb array, the pixel circuits 101 are arranged on the nth and (n+2)th columns on the mth row, and on the nth and (n+3)th columns on the (m+1)th row.

As an application example of the solid-state image sensor 100 according to this embodiment, a camera incorporating the solid-state image sensor 100 will be exemplified. The concept of the camera includes not only apparatuses mainly aiming at shooting but also apparatuses (for example, personal computer or portable terminal) having an auxiliary shooting function. The camera may be a module component such as a camera head. The camera includes the solid-state image sensor 100 according to the present invention exemplified as the embodiment, and a signal processing unit that processes a signal output from the solid-state image sensor 100. The signal processing unit can include, for example, a processor that processes digital data based on the signal obtained by the solid-state image sensor 100. An A/D converter configured to generate the digital data can be provided on the semiconductor substrate of the solid-state image sensor 100 or on another semiconductor substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-229121, filed Nov. 11, 2014, which is hereby incorporated by reference wherein in its entirety.

What is claimed is:

1. A semiconductor device including a substrate and an insulating layer, the substrate having a cell area and a peripheral area, unit circuits being arranged in a matrix in the cell area, the peripheral area being arranged around the cell area, and the insulating layer being arranged on the substrate, wherein in a plan view of a surface of the substrate, the insulating layer comprises:

a first region located on the cell area and having a rectangular outer edge including two sides along a row direction of the unit circuits and two sides along a column direction of the unit circuits;

a second region located on the peripheral area and having a rectangular inner edge including two sides along a row direction of the cell area and two sides along a column direction of the cell area;

a third region located on an intermediate area between the cell area and the peripheral area; and a fourth region located on the intermediate area, located between the second region and the third region, and forming a boundary with the third region, wherein a conductive member is embedded in the first region and the third region, and no conductive member is embedded in the fourth region, and the boundary has a curved portion.

2. The device according to claim 1, wherein a distance from at least one corner of the outer edge to the boundary equals a distance from at least one side of the outer edge continuing to the corner to the boundary.

3. The device according to claim 1, wherein the conductive member is embedded in the first region at a first pattern density, the conductive member is embedded in the second region at a second pattern density, and the conductive member is embedded in the third region at a third pattern density.

4. A semiconductor device including a substrate and an insulating layer, the substrate having a cell area and a peripheral area, unit circuits being arranged in a matrix in the cell area, the peripheral area being arranged around the cell area, and the insulating layer being arranged on the substrate, wherein in a plan view of a surface of the substrate, the insulating layer comprises:

a first region located on the cell area and having a rectangular outer edge including two sides along a row direction of the unit circuits and two sides along a column direction of the unit circuits;

a second region located on the peripheral area and having a rectangular inner edge including two sides along a direction row of the cell area and two sides along a column direction of the cell area;

a third region located on an intermediate area between the cell area and the peripheral area; and a fourth region located on the intermediate area, located between the second region and the third region, and forming a boundary with the third region, wherein a conductive member is embedded in the first region at a first pattern density, the conductive member is embedded in the second region at a second pattern density, the conductive member is embedded in the third region at a third pattern density, and the conductive member is embedded in the fourth region at a fourth pattern density, wherein the fourth pattern density is lower than the first pattern density, the second pattern density, and the third pattern density, and the boundary has a curved portion.

5. The device according to claim 4, wherein a distance from at least one corner of the outer edge to the boundary equals a distance from at least one side of the outer edge continuing to the corner to the boundary.

6. The device according to claim 3, wherein the third pattern density is not more than the first pattern density.

7. The device according to claim 3, wherein the third pattern density is a pattern density between the first pattern density and the second pattern density.

8. The device according to claim 7, wherein the third pattern density is not more than the first pattern density and not less than the second pattern density.

9. The device according to claim 1, wherein the third region is in contact with the inner edge.

10. The device according to claim 1, wherein a distance from the outer edge to the boundary is not less than 10 µm.

11. The device according to claim 1, wherein the conductive member embedded in the insulating layer comprises a contact plug.

12. The device according to claim 11, wherein the substrate includes a well in the cell area, and the conductive member in the third region comprises a contact plug for well contact configured to supply a potential of the well from outside of the cell area.

13. The device according to claim 1, wherein the conductive member in the third region is not used for electrical connection.

14. The device according to claim 1, wherein a distance from the outer edge to the boundary is constant throughout the outer edge.

15. The device according to claim 1, wherein the unit circuit comprises a pixel circuit, and the cell area comprises a light-receiving area.

16. A camera comprising:

a semiconductor device; and a signal processing unit configured to process a signal obtained by the semiconductor device, wherein the device includes a substrate and an insulating layer, the substrate has a cell area and a peripheral area, unit circuits is arranged in a matrix in the cell area, the peripheral area is arranged around the cell area, and the insulating layer is arranged on the substrate, wherein, in a plan view of a surface of the substrate, the insulating layer comprises:

a first region located on the cell area and having a rectangular outer edge including two sides along a row direction of the unit circuits and two sides along a column direction of the unit circuits;

a second region located on the peripheral area and having a rectangular inner edge including two sides along a row direction of the cell area and two sides along a direction column of the cell area;

a third region located on an intermediate area between the cell area and the peripheral area; and a fourth region located on the intermediate area, located between the second region and the third region, and forming a boundary with the third region, wherein a conductive member is embedded in the first region and the third region, and no conductive member is embedded in the fourth region, the boundary has a curved portion, the unit circuit comprises a pixel circuit, and the cell area comprises a light-receiving area.

17. A method of manufacturing a semiconductor device, wherein the device includes a substrate and an insulating layer, the substrate has a cell area and a peripheral area, unit circuits is arranged in a matrix in the cell area, the peripheral area is arranged around the cell area, and the insulating layer is arranged on the substrate, wherein in a plan view of a surface of the substrate, the insulating layer comprises:

a first region located on the cell area and having a rectangular outer edge including two sides along a row direction of the unit circuits and two sides along a column direction of the unit circuits;

a second region located on the peripheral area and having a rectangular inner edge including two sides along a row direction of the cell area and two sides along a column direction of the cell area;
a third region located on an intermediate area between the cell area and the peripheral area; and
a fourth region located on the intermediate area, located between the second region and the third region, and forming a boundary with the third region,
wherein a conductive member is embedded in the first region and the third region, and no conductive member is embedded in the fourth region, and
the boundary has a curved portion,
the method comprising:
forming the insulating layer on the substrate and forming an opening in the insulating layer;
depositing a conductive material on the substrate, thereby embedding the conductive material in the opening; and
removing a portion on the insulating layer of the conductive material by chemical mechanical polishing, thereby forming the conductive member.

* * * * *